(12) United States Patent
Chen et al.

(10) Patent No.: US 9,316,916 B2
(45) Date of Patent: Apr. 19, 2016

(54) METHOD TO MITIGATE RESIST PATTERN CRITICAL DIMENSION VARIATION IN A DOUBLE-EXPOSURE PROCESS

(75) Inventors: Kuang-Jung Chen, Poughkeepsie, NY (US); Wu-Song Huang, Brewster, NY (US); Wai-kin Li, Beacon, NY (US)

(73) Assignee: GLOBALFOUNRIES INC., Grand Cayman (KY)

( * ) Notice: Subject to any disclaimer, the term of this patent is extended or adjusted under 35 U.S.C. 154(b) by 1758 days.

(21) Appl. No.: 12/419,403

(22) Filed: Apr. 7, 2009

(65) Prior Publication Data

US 2010/0255428 A1    Oct. 7, 2010

(51) Int. Cl.
| | |
|---|---|
| G03F 7/207 | (2006.01) |
| G03F 7/40 | (2006.01) |
| G03F 7/00 | (2006.01) |
| G03F 7/20 | (2006.01) |
| G03F 7/38 | (2006.01) |

(52) U.S. Cl.
CPC ............... *G03F 7/40* (2013.01); *G03F 7/0035* (2013.01); *G03F 7/203* (2013.01); *G03F 7/2024* (2013.01); *G03F 7/2041* (2013.01); *G03F 7/38* (2013.01)

(58) Field of Classification Search
USPC .................................. 430/394, 326
See application file for complete search history.

(56) References Cited

U.S. PATENT DOCUMENTS

| | | |
|---|---|---|
| 6,861,209 B2 | 3/2005 | Li et al. |
| 2009/0004866 A1 | 1/2009 | Jung et al. |
| 2009/0011377 A1 | 1/2009 | Allen et al. |
| 2009/0311490 A1 * | 12/2009 | Burns et al. ............ 428/195.1 |

FOREIGN PATENT DOCUMENTS

| | | |
|---|---|---|
| CN | 1945444 A | 4/2007 |
| CN | 101034672 A | 9/2007 |
| JP | 2006215299 A | 8/2006 |
| JP | 2008008985 A | 1/2008 |
| JP | 2008078308 A | 4/2008 |
| JP | 2008233750 A | 10/2008 |
| JP | 2008258562 A | 10/2008 |
| KR | 20090001079 A | 1/2009 |

OTHER PUBLICATIONS

JPO Office Action Dated Oct. 22, 2013—Information Materials for IDS.

* cited by examiner

*Primary Examiner* — Daborah Chacko Davis
(74) *Attorney, Agent, or Firm* — Catherine Ivers; Hoffman Warnick LLC (57) ABSTRACT

A method to mitigate resist pattern critical dimension (CD) variation in a double-exposure process generally includes forming a photoresist layer over a substrate; exposing the photoresist layer to a first radiation; developing the photoresist layer to form a first pattern in the photoresist layer; forming a topcoat layer over the photoresist layer; exposing the topcoat layer and the photoresist layer to a second radiation; removing the topcoat layer; and developing the photoresist layer to form a second pattern in the photoresist layer.

20 Claims, 5 Drawing Sheets

METHOD TO MITIGATE RESIST PATTERN CRITICAL DIMENSION VARIATION IN A DOUBLE-EXPOSURE PROCESS

FIELD OF THE INVENTION

This invention relates generally to methods for semiconductor fabrication, and more particularly, to a method for mitigating resist pattern critical dimension (CD) variation in a double-exposure process.

BACKGROUND OF THE INVENTION

Semiconductor integrated circuits are typically manufactured using photolithography techniques. In a photolithography process, a photoresist layer is deposited on a substrate, such as a silicon wafer. The substrate is baked to remove solvent remained in the photoresist layer. The photoresist is exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

Immersion lithography is a photolithography resolution enhancement technique that the semiconductor industry has embraced for the 45 nm and 32 nm nodes, and possibly beyond. In an immersion lithography process, a liquid medium is placed between the final lens of the lithography tool and the wafer, replacing the air medium in a traditional dry lithography process. Compared to a dry lithography process, the immersion lithography can increase the resolution by a factor equal to the refractive index of the liquid. Current 193 nm immersion lithography tools use water as the liquid medium which has a refractive index of 1.44 at 193 nm.

One of the main challenges to the adoption of the 193 nm immersion lithography is defect control. Water has been shown to extract photoacid generators (PAGs) and photo generated acids from photoresist. The leaching of the PAGs and the acids into the water can create defects in the photoresist. In addition, the extracted PAGs and acids can also contaminate or corrode lens of the lithography tool. To battle against these concerns, a topcoat layer has been used to place directly on top of the photoresist. The topcoat serves as a barrier between the water and the photoresist and can effectively reduce the leaching of the PAGs and the acids from the photoresist into the water. The topcoat is generally an acidic material which can be removed by the aqueous base developer during the develop step of the photoresist.

To increase the feature density in an integrated circuit, the semiconductor industry has developed various double patterning techniques such as double-exposure and double-exposure double-etch. In a double-exposure process, a photoresist layer is exposed by a sequence of two separate exposures using two photomasks. This technique is commonly used to produce patterns in the same layer which are different or have incompatible densities or pitches. In a double-exposure double-etch process, a first layer of photoresist is exposed. The pattern formed in the first photoresist is transferred to an underlying hardmask layer by a first etch process to form a first pattern in the hardmask. A second layer of photoresist is coated on the hardmask. The second photoresist undergoes a second exposure to form a second pattern in the second photoresist. The first pattern in the hardmask and the second pattern in the second photoresist form a combined mask which is transferred to the final layer underneath in a second etch process. The double-exposure double-etch technique allows an increase in feature density.

Although double patterning techniques work relatively well in enhancing pattern density, there is a general concern that the CD of the pattern formed after the first exposure may vary during the subsequent processes, resulting in an additional source of CD variation.

SUMMARY OF THE INVENTION

In one aspect, the present invention relates to a photolithography method involving the steps of forming a photoresist layer over a substrate; exposing the photoresist layer to a first radiation; developing the photoresist layer to form a first pattern in the photoresist layer; forming a topcoat layer over the photoresist layer; exposing the topcoat layer and the photoresist layer to a second radiation; removing the topcoat layer; and developing the photoresist layer to form a second pattern in the photoresist layer.

It is preferred that exposing the topcoat layer and the photoresist layer to a second radiation is conducted using an immersion lithography process.

In another embodiment, the present invention relates to a photolithography method involving the steps of forming a photoresist layer over a substrate; forming a first topcoat layer over the photoresist layer; exposing the first topcoat layer and the photoresist layer to a first radiation; developing the photoresist layer to form a first pattern in the photoresist layer; forming a second topcoat layer on the photoresist layer; exposing the second topcoat layer and the photoresist layer to a second radiation; removing the second topcoat layer; and developing the photoresist layer to form a second pattern in the photoresist layer.

It is preferred that exposing the first topcoat layer and the photoresist layer to a first radiation and exposing the second topcoat layer and the photoresist layer to a second radiation are conducted using immersion lithography processes.

The topcoat layers may be removed by contacting the topcoat layers with an organic solvent. The organic solvent may include: 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents.

The topcoat layers preferably include a polymer containing an acidic group. The acidic group may include carboxylic acid, fluoroalcohol, fluorosulfonamide, or a combination comprising two or more of the foregoing groups. The topcoat layers are preferably soluble in an aqueous alkaline developer.

It is also preferred that the first radiation and the second radiation both have an imaging wavelength of about 193 nm.

The photolithography method may further include at least one of the steps of baking the substrate at a first temperature, prior to developing the photoresist layer to form a first pattern in the photoresist layer; baking the substrate at a second temperature, prior to developing the photoresist layer to form a second pattern in the photoresist layer; and transferring the second pattern into the substrate, after developing the photoresist layer to form a second pattern in the photoresist layer. Transferring the second pattern into the substrate may include etching or ion implanting portions of the substrate not covered by the photoresist layer.

The above described and other features are exemplified by the following figures and detailed description.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In describing the preferred embodiments of the present invention, reference will be made herein to FIGS. 1-11 of the drawings in which like numerals refer to like features of the invention. Features of the invention are not necessarily shown to scale in the drawings.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

The present invention provides a photolithography method which mitigates resist pattern CD variation in a double-exposure process. In this method, a photoresist layer is first exposed and developed to form a first pattern in the photoresist. A topcoat layer is formed on top of the patterned photoresist. The topcoat layer comprises a topcoat material commonly used for immersion lithography. The photoresist undergoes a second exposure. After the second exposure, the topcoat layer is removed using an organic solvent before the photoresist is developed. The photoresist is then developed to form a second pattern. Compared to a traditional double-exposure method in which the topcoat layer is removed when the photoresist is developed in an aqueous alkaline developer, the removal of the topcoat layer using an organic solvent before the development of the photoresist can significantly mitigate the CD variation of the first pattern.

Figure 1:
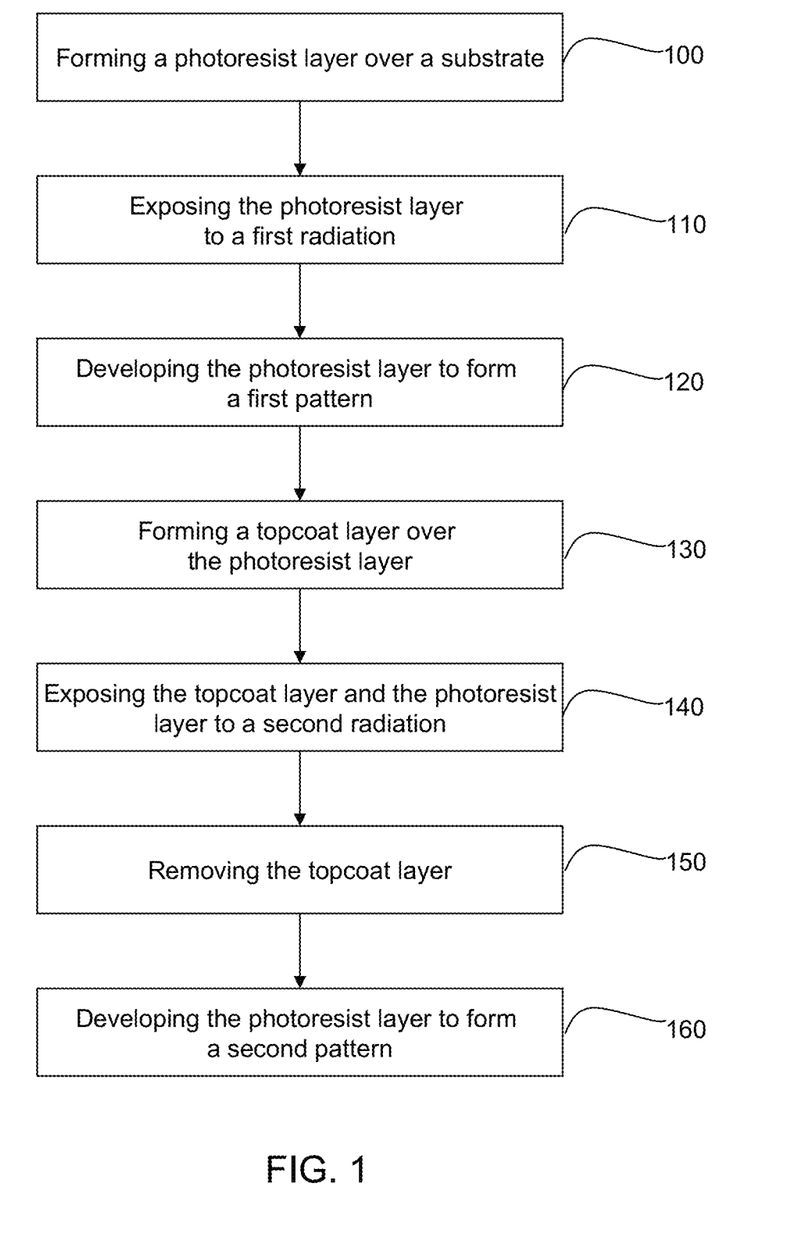
FIG. 1 is a flow chart illustrating a photolithography method, in accordance with an embodiment of the present invention.

FIG. 1 is a flow chart illustrating a photolithography method, in accordance with an embodiment of the present invention. Step 100 comprises forming a photoresist layer over a substrate. The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The photoresist may be any photoresist conventionally used in semiconductor industry, including 193 nm and 248 nm photoresists. Preferably, the photoresist used in the present invention is a chemically amplified photoresist. Both positive-tone photoresists and negative-tone photoresists are suitable to be used in the present invention. Generally, the photoresist may comprise a polymer containing an acid-labile group, a radiation sensitive component such as a photo acid generator (PAG), a solvent, and other performance enhancing additives, for example, a quencher, and a surfactant. The acid-labile group on the polymer may comprise a tertiary alkyl carbonate, a tertiary alkyl ester, a tertiary alkyl ether, an acetal, or a ketal.

The photoresist layer may be formed by virtually any standard means including spin coating. The photoresist layer may be baked (post applying bake (PAB)) to remove remaining solvent from the photoresist and improve the coherence of the photoresist layer. The preferred range of the PAB temperature for the photoresist layer is from about 70° C. to about 150° C., more preferably from about 90° C. to about 130° C. The preferred range of thickness of the photoresist layer is from about 20 nm to about 400 nm, more preferably from about 50 nm to about 300 nm.

Step 110 comprises exposing the photoresist layer to a first radiation. The first radiation employed in the present invention can be visible light, ultraviolet (UV), extreme ultraviolet (EUV) or electron beam (E-beam). It is preferred that the imaging wavelength of the first radiation is about 365 nm, 248 nm, 193 nm or 13 nm. More preferably, the imaging wavelength of the first radiation is about 193 nm. The exposure may be conducted using either a dry or an immersion lithography process.

In Step 120, the photoresist layer is developed to form a first pattern in the photoresist layer. The photoresist layer may be developed in an aqueous alkaline solution. It is preferred that the aqueous alkaline solution is a tetramethylammonium hydroxide (TMAH) solution. It is further preferred that the concentration of the TMAH solution is about 0.263 N. The aqueous base solution may further comprise additives, such as surfactants, polymers, isopropanol, ethanol, etc.

The substrate may be baked at a first temperature (post exposure bake (PEB)) after the photoresist layer is exposed with the first radiation and before it is developed. The preferred range of the first temperature is from about 60° C. to about 150° C., more preferably from about 80° C. to about 130° C. In some instances, it is possible to avoid the first bake since for certain chemistries, such as acetal and ketal chemistries, deprotection of the resist polymer proceeds at room temperature.

Step 130 comprises forming a topcoat layer over the photoresist layer. The topcoat layer may be a topcoat material commonly used at 193 nm immersion lithography. In one embodiment, the topcoat material includes a polymer containing an acidic group. Examples of suitable acidic groups include, but are not limited to, carboxylic acid, fluoroalcohol, fluorosulfonamide, or a combination comprising two or more of the foregoing groups. The topcoat material may further include at least one solvent. The solvent is preferably immiscible with the underlying photoresist. Suitable solvents include, but are not limited to, 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents. The topcoat layer is preferably soluble in an aqueous alkaline developer.

The topcoat layer may be formed by any standard means including spin coating. The topcoat layer may be baked to remove remaining solvent from the topcoat and improve the coherence of the topcoat layer. The preferred range of the bake temperature for the topcoat layer is from about 70° C. to about 130° C., more preferably from about 90° C. to about 110° C. The preferred range of thickness of the topcoat layer is from about 10 nm to about 200 nm, more preferably from about 30 nm to about 100 nm.

Step 140 comprises exposing the topcoat layer and the photoresist layer to a second radiation. The second radiation can be visible light, UV, EUV or E-beam. It is preferred that the imaging wavelength of the second radiation is about 365 nm, 248 nm, 193 nm or 13 nm. It is more preferred that the imaging wavelength of the second radiation is about 193 nm. The exposure may be conducted using either a dry or an immersion lithography process. Preferably, the exposure of the topcoat layer and the photoresist layer is conducted using an immersion lithography process.

Step 150 includes removing the topcoat layer. The topcoat layer may be removed by contacting the topcoat layer with an organic solvent. The organic solvent preferably does not dissolve the underlying photoresist layer. Examples of suitable organic solvents include, but are not limited to, 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents.

In Step 160, the photoresist layer is developed to form a second pattern in the photoresist. The photoresist layer may be developed in an aqueous alkaline solution. It is preferred that the aqueous base solution is a TMAH solution. The concentration of the TMAH solution is preferably about 0.263 N. The aqueous base solution may further comprise additives, such as surfactants, polymers, isopropanol, ethanol, etc.

The substrate may be baked at a second temperature after the topcoat layer is removed and before the photoresist is developed. The preferred range of the second temperature is from about 60° C. to about 150° C., more preferably from about 80° C. to about 130° C. In some instances, it is possible to avoid the second bake since for certain chemistries, such as acetal and ketal chemistries, deprotection of the resist polymer proceeds at room temperature.

The second pattern in the photoresist can be transferred into the substrate by removing portions of the substrate not covered by the patterned photoresist layer. Typically, portions of the substrate are removed by reactive ion etching or some other technique known to one skilled in the art. The second pattern may also be transferred to the substrate by ion implanting portions of the substrate not covered by the photoresist. The method of the invention may be used to create patterned structures such as metal wiring lines, holes for contacts or vias, insulation sections (e.g., damascene trenches or shallow trench isolation), trenches for capacitor structures, etc. as might be used in the design of integrated circuit devices.

FIGS. 2-8 are cross-sectional views illustrating exemplary processing step in accordance with embodiments of the present invention. In FIG. 2a, a photoresist layer 202 is formed over a substrate 200, such as described in Step 100 above. Although not shown, the substrate 200 may include one or more semiconductor layers or structures such as substrate layers, dielectric layers, and bottom anti-reflective coating (BARC) layers, and may include active or operable portions of semiconductor devices. The photoresist layer 202 is preferably formed by spin-coating. A PAB step may be performed to remove any remaining solvent in the photoresist layer 202.

Figure 2A:
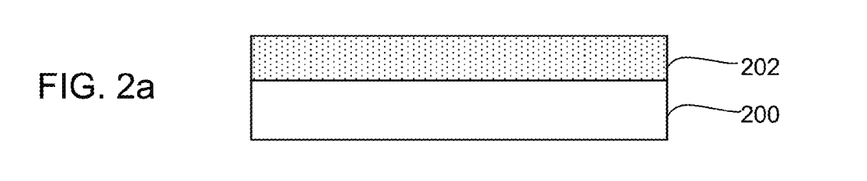
FIGS. 2-8 are cross-sectional views that illustrate exemplary processing steps of a photolithography method, in accordance with embodiments of the present invention.
Figure 2B:
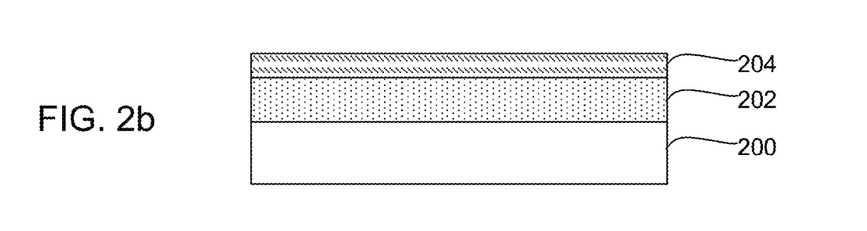

Optionally, but not necessarily, a first topcoat layer 204 may be formed over the photoresist layer 202, as shown in FIG. 2b. The first topcoat layer 204 may prevent the components in the photoresist layer 202 from leaching into the water in an immersion lithography process. The first topcoat layer 204 preferably includes a polymer containing an acidic group. The acidic group may include carboxylic acid, fluoroalcohol, fluorosulfonamide, or a combination comprising two or more of the foregoing groups. The first topcoat layer 204 is preferably soluble in an aqueous alkaline developer.

The topcoat material used to form the first topcoat layer 204 may further include at least one solvent. The solvent is preferably immiscible with the underlying photoresist layer 202. Suitable solvents include, but are not limited to, 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents.

The first topcoat layer 204 may be formed by any standard means including spin coating. The first topcoat layer 204 may be further baked to remove remaining solvent from the topcoat and improve the coherence of the topcoat layer. The preferred range of the bake temperature for the topcoat layer 204 is from about 70° C. to about 130° C., more preferably from about 90° C. to about 110° C. The preferred range of thickness of the topcoat layer 204 is from about 10 nm to about 200 nm, more preferably from about 30 nm to about 100 nm.

Figure 3:
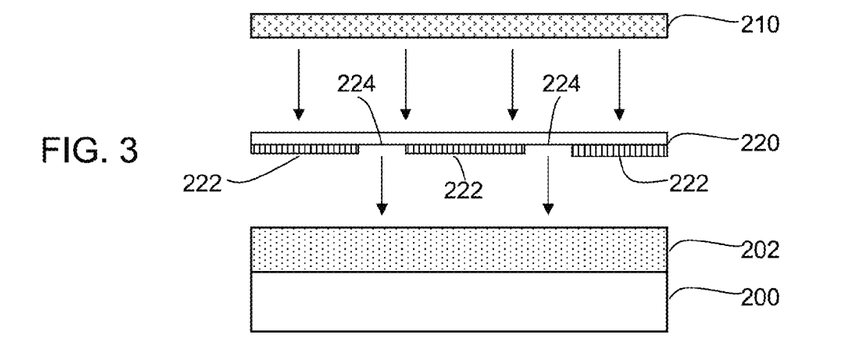

In FIG. 3, the photoresist layer 202 is exposed to a first radiation 210 through a first patterned photomask 220, such as described in Step 110 above. The first exposure may be conducted using either a dry or an immersion lithography process. Preferably, the first exposure is conducted using an immersion lithography process.

The patterned mask 220 comprises a pattern in which masked sections 222 are essentially opaque to the radiation or impenetrable to the energetic particles, and unmasked sections 224 are essentially transparent to the radiation or penetrable to the energetic particles. Radiation or particles passing through the unmasked sections 224 may be transmitted to the photoresist layer 202, wherein the radiation or particles may induce the production of an acid in the exposed regions of the photoresist layer 202. Unexposed regions of the photoresist layer 202 may not produce an acid. Exposure to the radiation or energetic particles may render the exposed regions soluble in an aqueous alkaline developer.

The patterned mask 220 employed in the present invention can be any photomask commonly used in photolithographic processes including attenuated PSMs. The pattern feature on the patterned mask 220 may include, but is not limited to, lines, trenches and contact holes.

Figure 4:
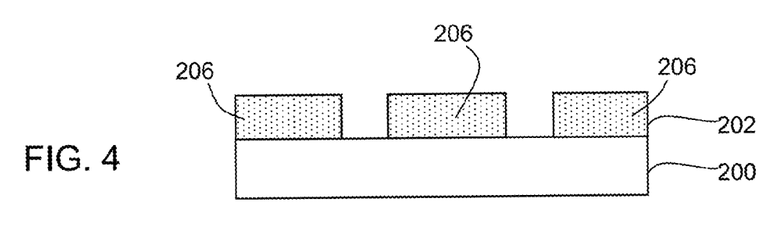

FIG. 4 is an illustration of the substrate 200 and the photoresist layer 202 after developing the photoresist layer 202 in an aqueous alkaline developer, such as described in Step 120 above. A first pattern 206 is formed in the photoresist layer 202.

Figure 5:
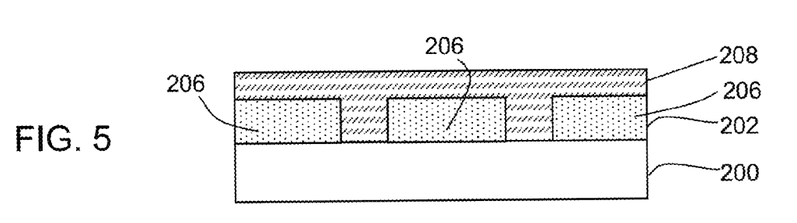

In FIG. 5, a topcoat layer 208 is formed over the patterned photoresist layer 202. If the first topcoat layer 204 was applied over the photoresist layer 202 before the first exposure, the topcoat layer 208 would be the second topcoat layer used in the process. The topcoat layer 208 preferably includes a polymer containing an acidic group. The acidic group may include carboxylic acid, fluoroalcohol, fluorosulfonamide, or a combination comprising two or more of the foregoing groups. It is preferred that the topcoat layer 208 is soluble in an aqueous alkaline developer. The topcoat layer 208 may prevent the components in the photoresist layer 202 from leaching into the water in an immersion lithography process.

Figure 6:
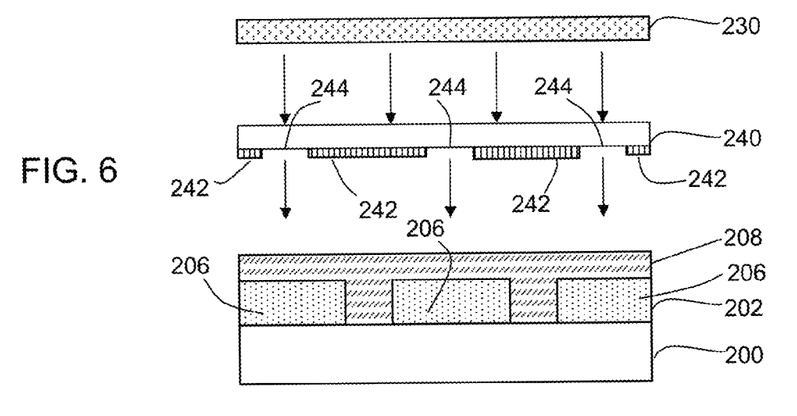

In FIG. 6, the topcoat layer 208 and the photoresist layer 202 are exposed to a second radiation 230 through a second patterned photomask 240, such as described in Step 140 above. The patterned mask 240 comprises a pattern in which masked sections 242 are essentially opaque to the radiation or impenetrable to the energetic particles, and unmasked sections 244 are essentially transparent to the radiation or penetrable to the energetic particles. Radiation or particles passing through the unmasked sections 244 may be transmitted to the topcoat layer 208 and the photoresist layer 202, wherein the radiation or particles may induce the production of an acid in the exposed regions of the photoresist layer 202. Unexposed regions of the photoresist layer 202 may not produce an acid. Exposure to the radiation or energetic particles may render the exposed regions soluble in an aqueous alkaline developer.

Likewise, the patterned mask 240 can be any photomask commonly used in photolithographic processes including attenuated PSMs. The pattern feature on the patterned mask 240 may include, but is not limited to, lines, trenches and contact holes.

Figure 7:
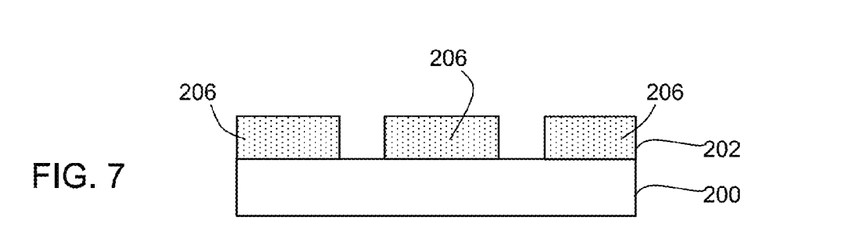

FIG. 7 is an illustration of the substrate 200 and the photoresist layer 202 after removing the topcoat layer 208, such as described in Step 150 above. The topcoat layer 208 may be removed by contacting it with an organic solvent.

Figure 8:
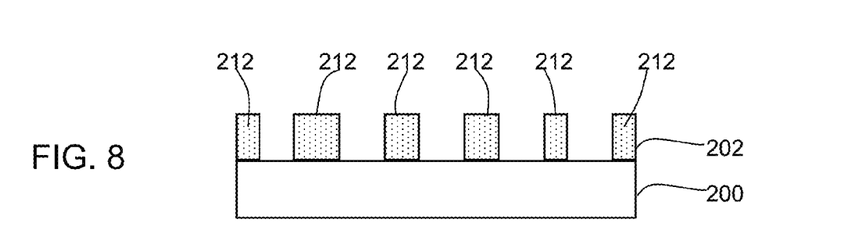

In FIG. 8, the photoresist layer 202 is developed in an aqueous alkaline developer to form a second pattern 212, such as described in Step 160 above. The substrate 200 may be baked before the photoresist layer 202 is developed.

EXAMPLE 1

A silicon substrate was coated with 42 nanometers of a bottom antireflective coating (BARC) commercially available under the trademark AR40 from the Rohm & Haas Company. A 193 nm photoresist layer was deposited on top of the BARC at a thickness of 150 nanometers. The 193 nm photoresist is commercially available under the trademark EPIC2370 from the Rohm & Haas Company. A first topcoat layer was formed on top of the photoresist layer at a thickness of 90 nanometers. The first topcoat is commercially available under the trademark TCX41 from the Japan Synthetic Rubber Company. The photoresist was exposed for the first time using an ArF immersion lithographic scanner and developed to form a first pattern in the photoresist. A second topcoat layer was formed on top of the patterned photoresist layer at a thickness of 90 nanometers. The second topcoat is also TCX41 from the Japan Synthetic Rubber Company. The photoresist was exposed for the second time using an ArF immersion lithographic scanner. The second topcoat layer was then removed with 4-methyl-2-pentanol using spin coater. The photoresist was then developed in a 0.263 N TMAH solution to form a second pattern in the photoresist.

Figure 9:
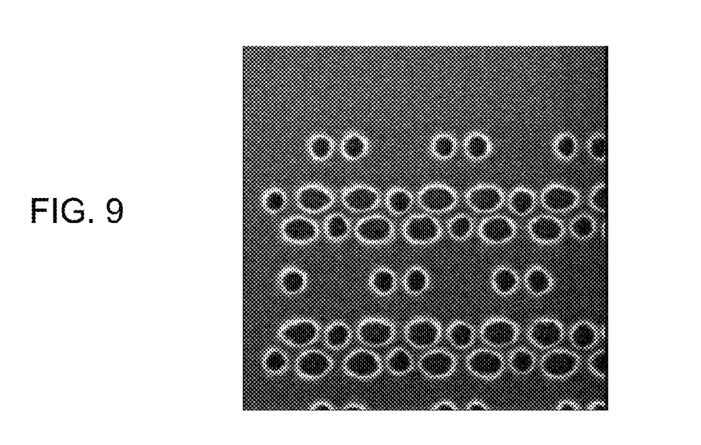
FIG. 9 illustrates a scanning electron micrograph of a top down view of a patterned photoresist after the first exposure created in accordance with the process flow of FIG. 1.
Figure 10:
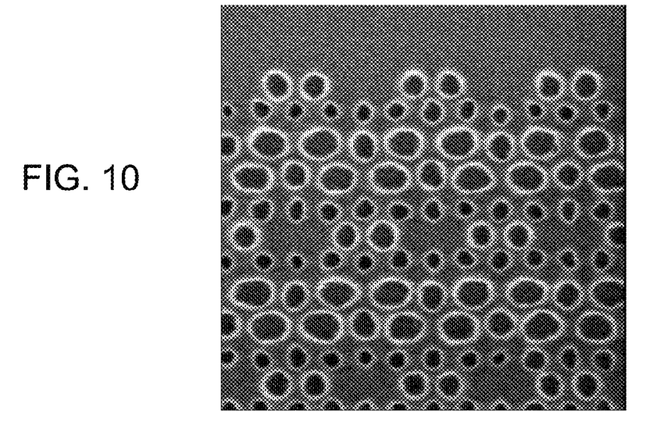
FIG. 10 illustrates a scanning electron micrograph of a top down view of a patterned photoresist after the second exposure created in accordance with the process flow of FIG. 1.
Figure 11:
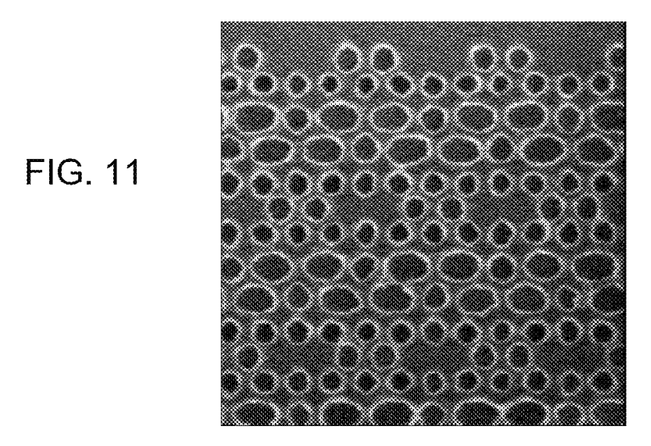
FIG. 11 illustrates a scanning electron micrograph of a top down view of a patterned photoresist after the second exposure created using a standard double-exposure process.

FIGS. 9 and 10 are scanning electron micrographs of a top down view of the first and the second patterns formed in Example 1 respectively. The first pattern in FIG. 9 is part of the second pattern in FIG. 10. There is little change in the CD of the first pattern after the second exposure and development.

In comparison, a photoresist pattern was also created using a standard double-exposure process. In the standard process, a first pattern was created using the same procedures as described in Example 1 (FIG. 9). A second topcoat layer was deposited on top of the patterned photoresist layer and the photoresist was exposed for the second time using an ArF immersion lithographic scanner, same as described in Example 1. The photoresist was then developed in a 0.263 N TMAH solution to form a second pattern in the photoresist. The first pattern in FIG. 9 is part of the second pattern in FIG. 11. The CD of the first pattern is enlarged after the second exposure and development in the standard double-exposure process.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A photolithography method comprising:
   forming a photoresist layer over a substrate;
   exposing the photoresist layer to a first radiation;
   developing the photoresist layer to form a first pattern in the photoresist layer;
   forming a topcoat layer over the patterned photoresist layer;
   exposing the topcoat layer and the patterned photoresist layer to a second radiation;
   removing the topcoat layer with an organic solvent, wherein the organic solvent does not dissolve the photoresist layer; and
   developing the patterned photoresist layer to form a second pattern in the photoresist layer.

2. The method of claim 1, wherein the organic solvent comprises 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents.

3. The method of claim 1, wherein exposing the topcoat layer and the patterned photoresist layer to the second radiation is conducted using an immersion lithography process.

4. The method of claim 1, wherein the topcoat layer comprises a polymer containing an acidic group.

5. The method of claim 4, wherein the acidic group comprises carboxylic acid, fluoroalcohol, fluorosulfonamide, or a combination comprising two or more of the foregoing groups.

6. The method of claim 1, wherein the first radiation and the second radiation both have an imaging wavelength of about 193 nm.

7. The method of claim 1, further comprising:
baking the substrate at a first temperature, prior to developing the photoresist layer to form the first pattern in the photoresist layer.

8. The method of claim 1, further comprising:
baking the substrate at a second temperature, prior to developing the patterned photoresist layer to form the second pattern in the photoresist layer.

9. The method of claim 1, further comprising:
transferring the second pattern into the substrate, after developing the photoresist layer to form the second pattern in the photoresist layer.

10. The method of claim 9, wherein transferring the second pattern into the substrate comprises etching or ion implanting portions of the substrate not covered by the photoresist layer.

11. A photolithography method comprising:
forming a photoresist layer over a substrate;
forming a first topcoat layer over the photoresist layer;
exposing the first topcoat layer and the photoresist layer to a first radiation;
developing the photoresist layer to remove the first topcoat layer and to form a first pattern in the photoresist layer;
forming a second topcoat layer on the patterned photoresist layer;
exposing the second topcoat layer and the patterned photoresist layer to a second radiation;
removing the second topcoat layer with an organic solvent, wherein the organic solvent does not dissolve the photoresist layer; and
developing the patterned photoresist layer to form a second pattern in the photoresist layer.

12. The method of claim 11, wherein the organic solvent comprises 1-butanol, methanol, ethanol, 1-propanol, ethylene glycol, 1,2-butanediol, 1,3-butanediol, 1,4-butanediol, 1,2-propanediol, 1,3-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, decane, or a combination comprising two or more of the foregoing solvents.

13. The method of claim 11, wherein exposing the first topcoat layer and the photoresist layer to the first radiation and exposing the second topcoat layer and the patterned photoresist layer to the second radiation are conducted using immersion lithography processes.

14. The method of claim 11, wherein the first and second topcoat layers comprise a polymer containing an acidic group.

15. The method of claim 14, wherein the acidic group comprises carboxylic acid, fluoroalcohol, fluorosulfonamide, or a combination comprising two or more of the foregoing groups.

16. The method of claim 11, wherein the first radiation and the second radiation both have an imaging wavelength of about 193 nm.

17. The method of claim 11, further comprising:
baking the substrate at a first temperature, prior to developing the photoresist layer to form the first pattern in the photoresist layer.

18. The method of claim 11, further comprising:
baking the substrate at a second temperature, prior to developing the patterned photoresist layer to form the second pattern in the photoresist layer.

19. The method of claim 11, further comprising:
transferring the second pattern into the substrate, after developing the photoresist layer to form the second pattern in the photoresist layer.

20. The method of claim 19, wherein transferring the second pattern into the substrate comprises etching or ion implanting portions of the substrate not covered by the photoresist layer.

* * * * *